United States Patent [19]

Maezawa

[11] Patent Number: 5,313,117
[45] Date of Patent: May 17, 1994

[54] SEMICONDUCTOR LOGIC CIRCUIT USING TWO N-TYPE NEGATIVE RESISTANCE DEVICES

[75] Inventor: Koichi Maezawa, Kanagawa, Japan

[73] Assignee: Nippon Telegraph and Telephone Corporation, Tokyo, Japan

[21] Appl. No.: 913,108

[22] Filed: Jul. 14, 1992

[30] Foreign Application Priority Data

Jul. 22, 1991 [JP] Japan .................................. 3-204607
Feb. 10, 1992 [JP] Japan .................................. 4-056622

[51] Int. Cl.⁵ .......................................... H03K 17/125
[52] U.S. Cl. .................................. 307/450; 307/443; 307/322; 257/104
[58] Field of Search ............... 307/450, 443, 446, 461, 307/478, 322, 482.1; 257/78, 104, 105

[56] References Cited

U.S. PATENT DOCUMENTS

| 3,324,308 | 6/1967 | Alford ............................ 307/461 |
| 4,242,595 | 12/1980 | Lehovec ........................ 257/105 X |
| 4,835,581 | 5/1989 | Kuroda et al. .................. 257/105 |
| 5,151,618 | 9/1992 | Yokoyama et al. ............ 307/478 X |

FOREIGN PATENT DOCUMENTS

0690942 7/1964 Canada .............................. 307/461

OTHER PUBLICATIONS

H. C. Liu et al., "Heterojunction Double-Barrier Diodes for Logic Applications", Appl. Phys. Lett. 50(18), 4 May 1987, pp. 1246-1248.

W. B. Kinard et al., "Fabrication of a Gated Gallium Arsenide Heterostructure Resonant Tunneling Diode", J. Vac. Sci. Technol. B 8(3), May/Jun. 1990, pp. 393-396.

Federico Capasso et al., "Quantum Functional Devices: Resonant-Tunneling Transistors, Circuits With Reduced Complexity, and Multiple-Valued Logic", IEEE Transactions on Electron Devices, vol. 36, No. 10, Oct. 1989, pp. 2065-2082.

J. R. Söderström et al., "New Negative Differential Resistance Device Based on Resonant Interband Tunneling", Appl. Phys. Lett. 55(11), 11 September 1989, pps. 1094-1096.

J. R. Söderström et al., "Demonstration of Large Peak-To-Valley Current Ratios in InAs/AlGaSb/InAs Single-Barrier Hetero-Structures", Appl. Phys. Lett. 55(13), 25 September 1989, pps. 1348-1350.

*Primary Examiner*—David R. Hudspeth
*Attorney, Agent, or Firm*—Townsend and Townsend Khourie and Crew

[57] ABSTRACT

A semiconductor elements having N-type negative resistance characteristics are connected in series to obtain a series circuit. The two ends of the series circuit serve as drive voltage terminals to which periodic drive voltages are applied. At least one of the semiconductor elements has a control electrode to which a voltage is applied to change the peak current. A connection point between the two semiconductor elements serves as an output terminal.

10 Claims, 16 Drawing Sheets

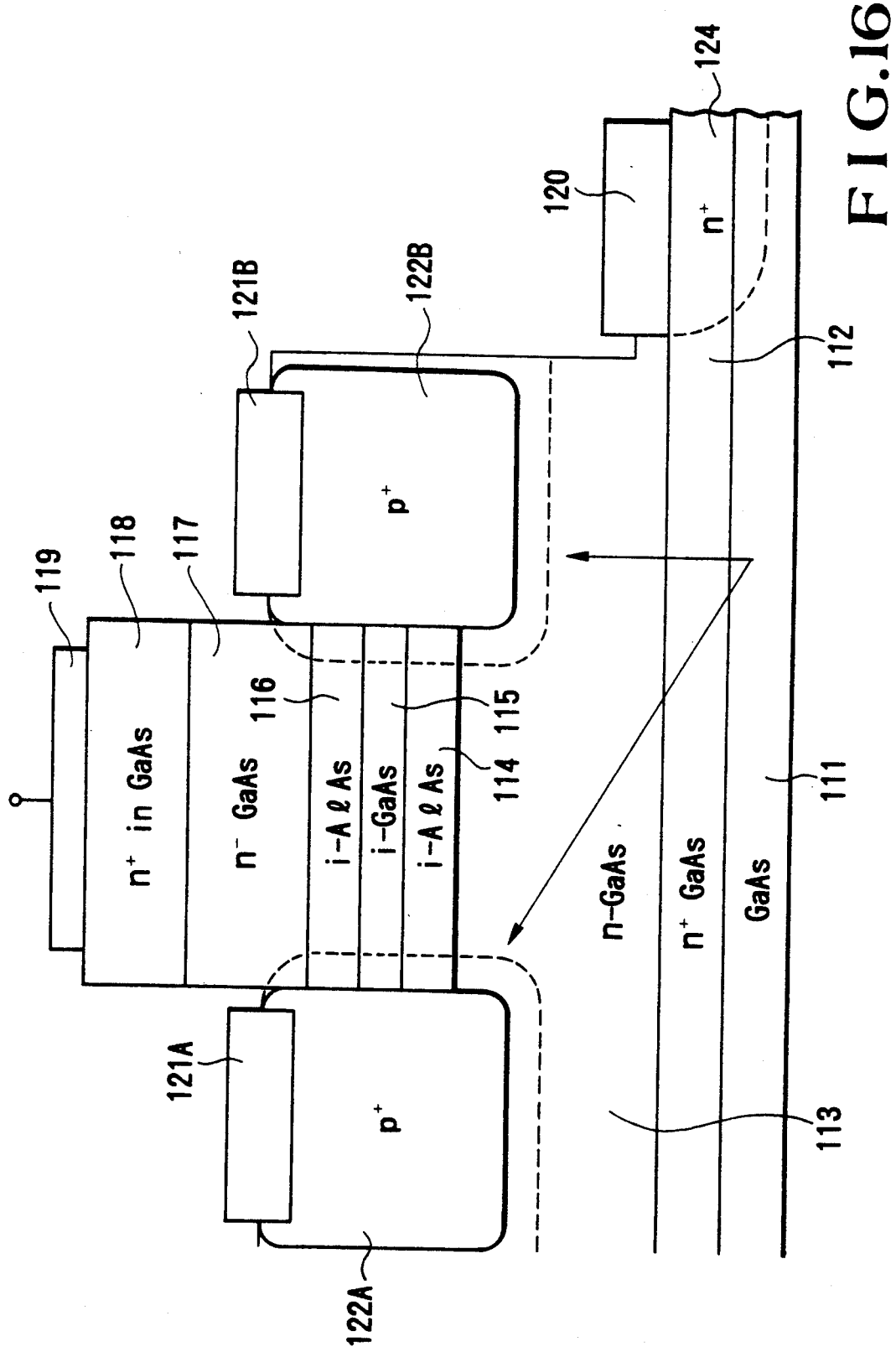

SEMICONDUCTOR LOGIC CIRCUIT USING TWO N-TYPE NEGATIVE RESISTANCE DEVICES

BACKGROUND OF THE INVENTION

The present invention relates to a high-speed, multi-functional semiconductor logic circuit device.

As such semiconductor logic circuit devices, various types of devices have been proposed. As a conventional logic circuit expected to perform a high-speed operation, a circuit as in FIG. 18 has been proposed. A similar arrangement is disclosed by McCarthy, "Mos Devices and Circuit Design", John Willey & Sons. The logic circuit shown in FIG. 18 is an inverter constituted by a combination of enhancement and depletion type MOSFETs. In this case, an enhancement type element 50 is used as a driver element, whereas a depletion type element 51 is used as a load element. Assume first that a pulse input is supplied to the input terminal of the driver element 50, and the input level changes from low level to high level. In this case, the driver element 50 is switched from an OFF state to an ON state, and the output voltage changes from high level to low level. With this change in level, the charge accumulated in an output capacitor 52 is extracted by a current flowing in the driver element 50. Therefore, a switching time $\tau_{on}$ is given by $$\tau_{on} = C_{out} \cdot VL/(gm^d \cdot VL) = C_{out}/gm^d$$

where $C_{out}$ is the output capacitance, VL is the change in output voltage, and $gm^d$ is the average transconductance of the driver element.

Assume next that the input level of the driver element 50 changes from high level to low level. Similar to the above case, $$\tau_{off} = C_{out} \cdot VL/(gm^l \cdot VL) = C_{out}/gm^l$$

where $gm^l$ is the average transconductance of the load element 51.

As indicated by the above equations, the switching speed at which low level is switched to high level, or vice versa is equal to the value obtained by dividing the output capacitance $C_{out}$ by the average transconductance $gm^d$ or $gm^l$. If the fan-out and the input capacitance of an element are respectively represented by m and $C_{in}$, and the wiring capacitance is neglected, the output capacitance is given by $$C_{out} = mC_{in}$$

Therefore, the switching time of the inverter having such an arrangement is increased in proportion to the fan-out. That is, the operating speed of a conventional logic gate is decreased with an increase in fan-out. The arrangement constituted by MOSFETs has been described above, because the input capacitor and the driving performance for charging it are closely related to each other. The above-described problem equally applies to other circuit arrangements (e.g., a circuit constituted by CMOSs).

SUMMARY OF THE INVENTION

It is, therefore, a principal object of the present invention to provide a semiconductor logic circuit device capable of high-speed operation regardless of fan-out.

It is another object of the present invention to provide a semiconductor logic circuit device using a resonant tunneling type negative resistive element which can be easily manufactured and allows only a small amount of leakage current.

It is still another object of the present invention to provide a semiconductor logic circuit device which uses a resonant tunneling type negative resistive element to realize a high-frequency operation and allow a large number of inputs and outputs.

In order to achieve the above objects, according to an aspect of the present invention, there is provided a semiconductor logic circuit device, wherein two semiconductor elements having N-type negative resistance characteristics are connected in series to obtain a series circuit, two ends of the series circuit serve as drive voltage terminals to which periodic drive voltages are applied, at least one of the semiconductor elements has a control electrode to which a voltage is applied to change the peak current, and a connection point between the two semiconductor elements serves as an output terminal.

BRIEF DESCRIPTION OF THE DRAWINGS

FIGS. 16 and 17 are views respectively showing the sixth and seventh embodiments of the present invention.

DETAILED DESCRIPTION OF THE PREFERRED EMBODIMENTS

Embodiments of the present invention will be described in detail below with reference to the accompanying drawings.

Figure 1:
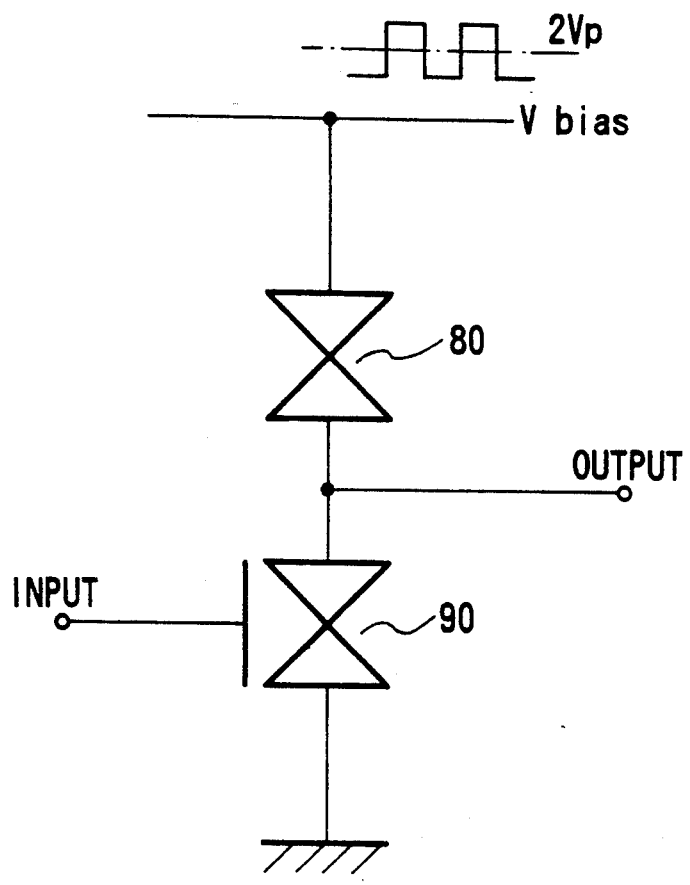
FIG. 1 is a circuit diagram showing the basic arrangement of a semiconductor logic circuit device according to the present invention.
Figure 2A:
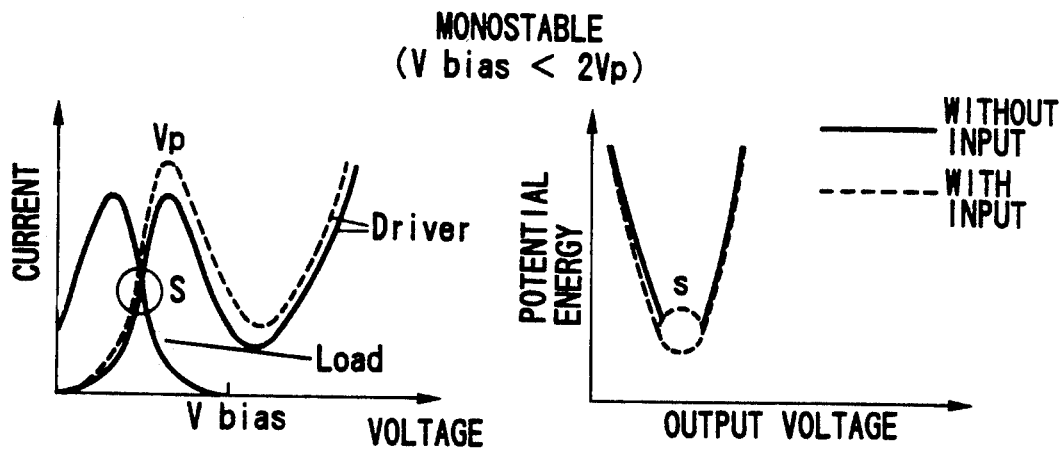
FIGS. 2A to 2C are graphs showing load characteristics and potential energy characteristics to explain an operation of the device shown in FIG. 1.
Figure 2B:
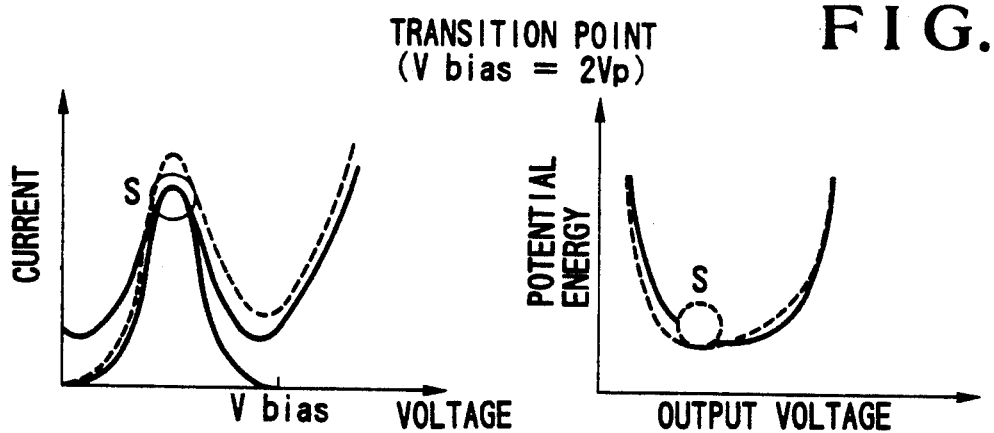
Figure 2C:
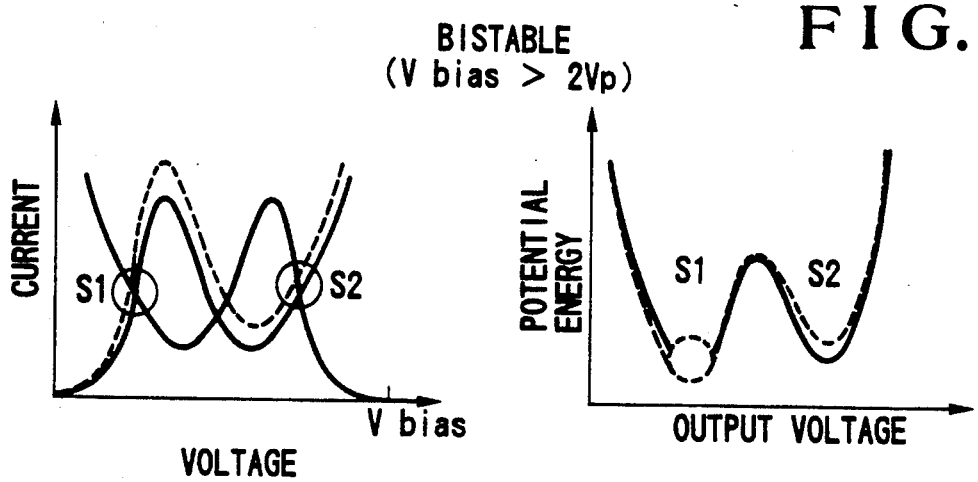

FIG. 1 shows the basic arrangement of a semiconductor logic circuit device according to the present invention, particularly exemplifying a logic gate (inverter). The basic arrangement of the present invention is characterized in that two N-type negative resistive elements, at least one of which has a current control terminal, are connected in series, and an oscillating voltage is applied to the circuit to drive it. FIGS. 2A to 2C show load curves in this circuit and corresponding potential energy characteristics of the circuit. Referring to FIGS. 2A to 2C, solid curves represent characteristics obtained when the two negative resistive elements are equivalent; and broken curves, characteristics obtained when positive input voltages are applied to a driver element. When a drive voltage $V_{bias}$ is lower than twice a peak voltage $V_p$, only one stable point S is present, and hence the circuit is monostable. FIG. 2A shows this state. When the drive voltage $V_{bias}$ is equal to twice the peak voltage $V_p$, the operating point shifts to a point near a peak point of a current, as shown in FIG. 2B. When the drive voltage $V_{bias}$ exceeds $2V_p$, two stable points S1 and S2 appear in the circuit, and the potential energy curve of the circuit has two minimum peaks. In this case, one of the stable points at which the circuit is stabilized can be selected by setting a difference between peak currents in the two resonant tunneling transistors. If, for example, a positive input voltage is applied to the driver element, as indicated by the broken curve, the peak current is increased, and the circuit is stabilized at the stable point S1. In this case, only a very small peak current change is required to select a stable point of the circuit. For this reason, the transconductance can be set to be very small and so is the input capacitance proportional thereto. Unlike a conventional logic gate, in this logic gate, a current for driving each succeeding stage is supplied by a drive voltage, the driving performance is irrelevant to the transconductance. Therefore, the operating speed is not decreased with an increase in fan-out. That is, the switching time of this logic gate is determined by the response speed of a resonant tunneling diode itself regardless of fan-out (because the input capacitance can be sufficiently reduced). It is being predicted and proved that the resonant tunneling diode can be operated at a very high speed. This constitutes a major characteristic feature of the present invention in comparison with the conventional logic gate.

Figure 3:
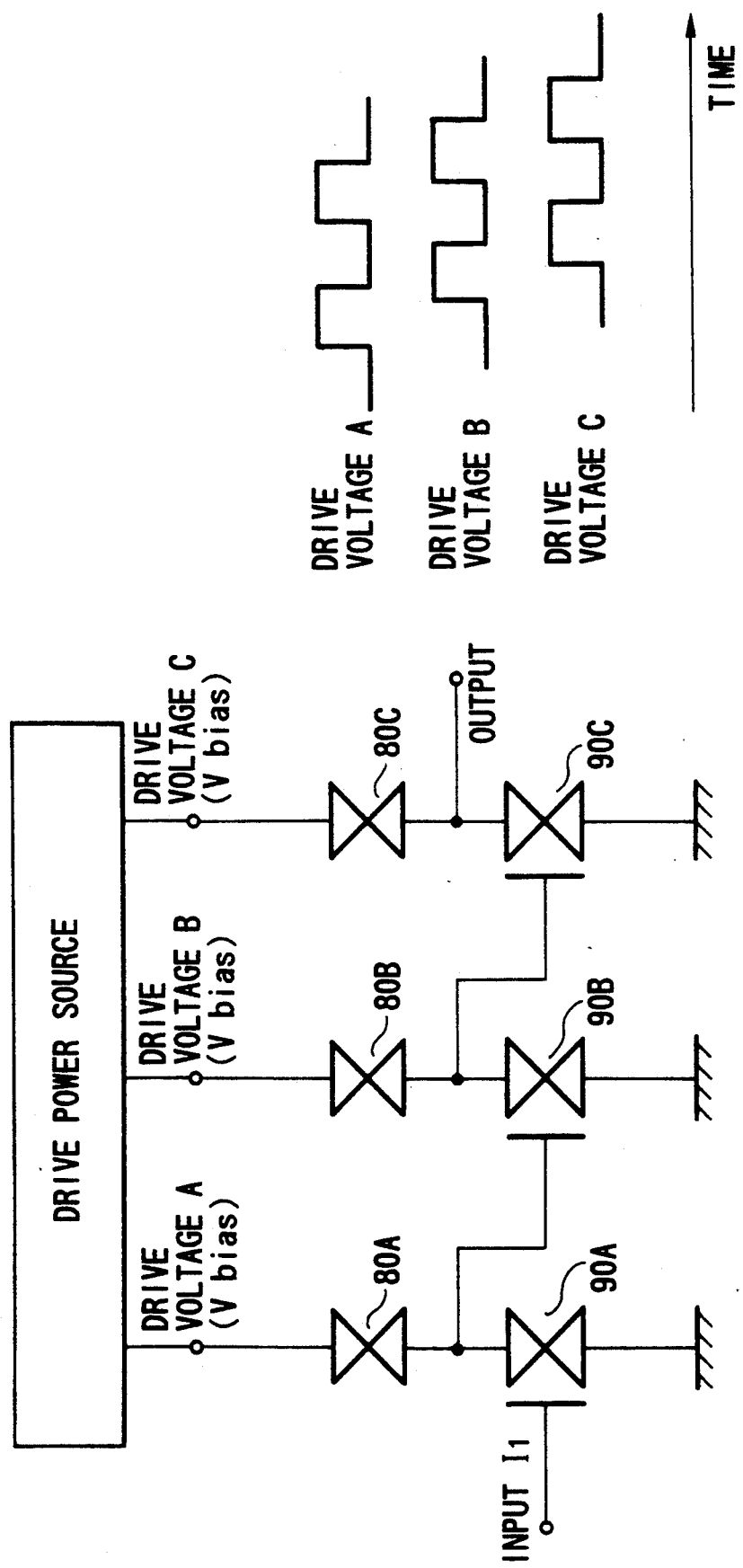
FIG. 3 is a view showing an arrangement obtained by connecting a plurality of stages, each identical to the basic arrangement shown in FIG. 1, and signal waveforms for driving the respective stages.

In order to operate this circuit as a logic gate, a periodic voltage oscillating across $2V_p$ is used as a drive voltage. In order to use an output from the first logic gate as an input to the second logic gate, the phase of a drive voltage for the second logic gate must be delayed from that for the first logic gate. For example, in a multistage circuit in which a plurality of inverters are connected to each other, as shown in FIG. 3, three-phase drive voltages, as indicated by reference symbols A, B, and C in FIG. 3, may be applied to the respective stages. Furthermore, when the logic gates are to be connected to each other, the drive voltage A may be repeatedly applied to each succeeding stage. This arrangement will be described in more detail later with reference to FIGS. 9A, 9B, 10A, and 10B.

Figure 4:
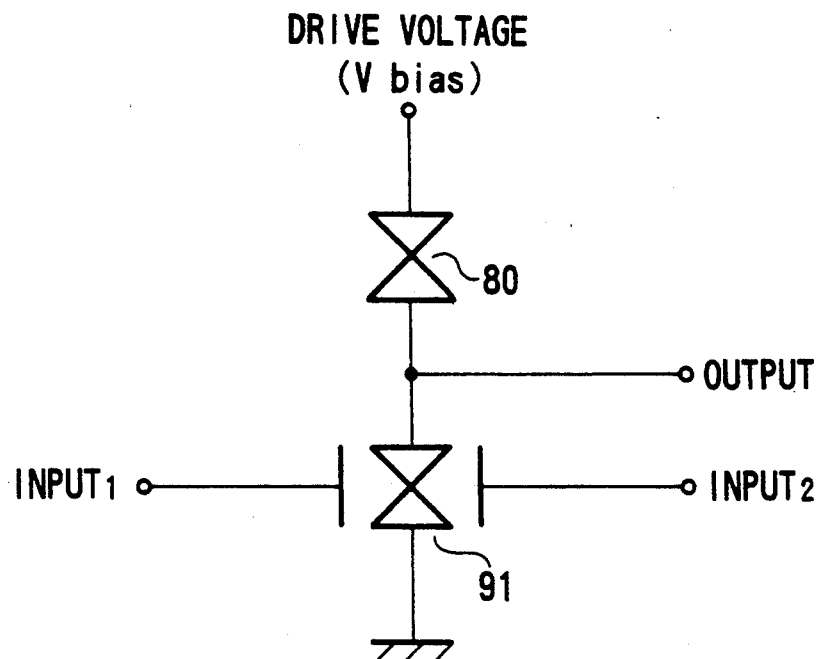
FIGS. 4 to 7 are circuit diagrams respectively showing modifications of the semiconductor logic circuit device of the present invention.
Figure 5:
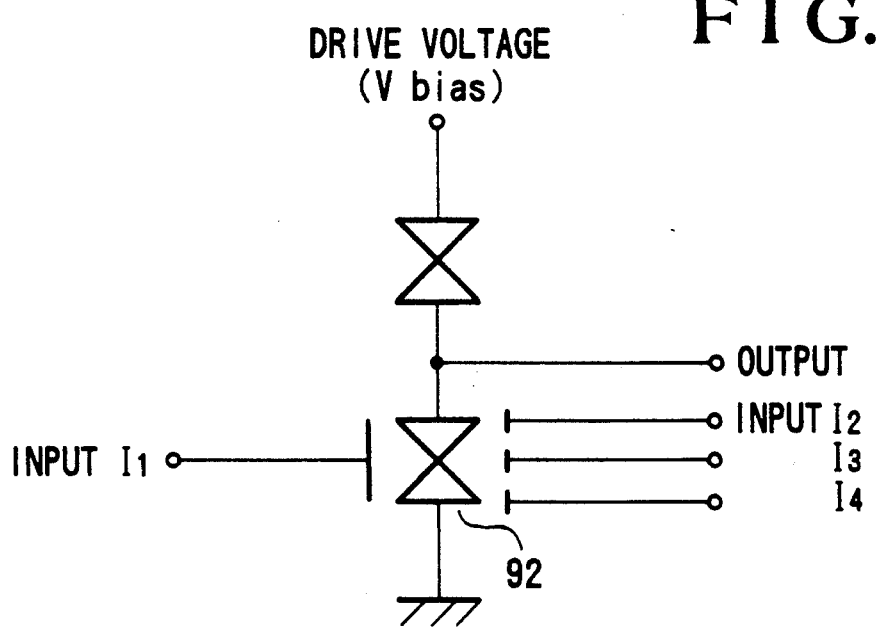

In addition, a large number of input electrodes can be arranged. For example, FIG. 4 shows a two-input element having first and second inputs I1 and I2. FIG. 5 shows an element having four differently weighted inputs I1, I2, I3, and I4. For example, weighting is performed by setting the sizes of the gate or control electrodes to be different from each other. In this case, an output is determined by a total change in peak currents of all inputs, and a threshold value circuit having positive and negative values is obtained.

Figure 6:
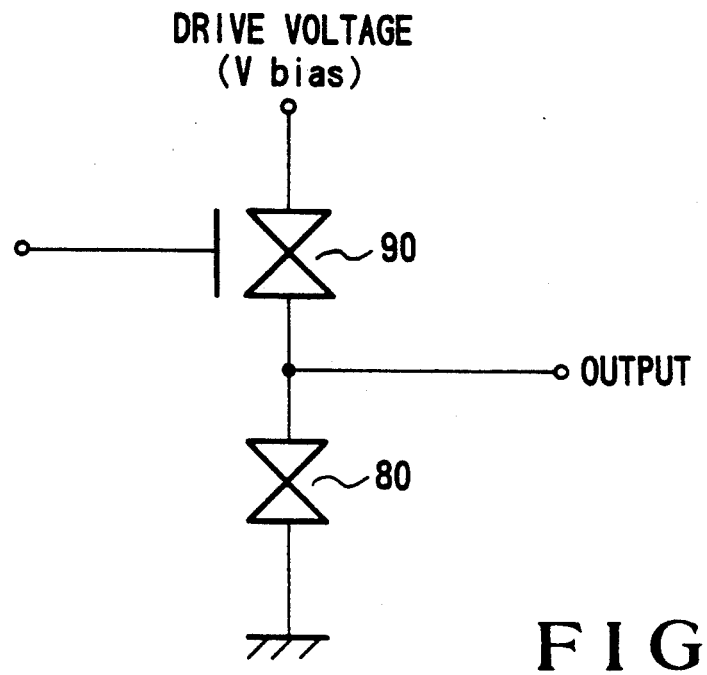
Figure 7:
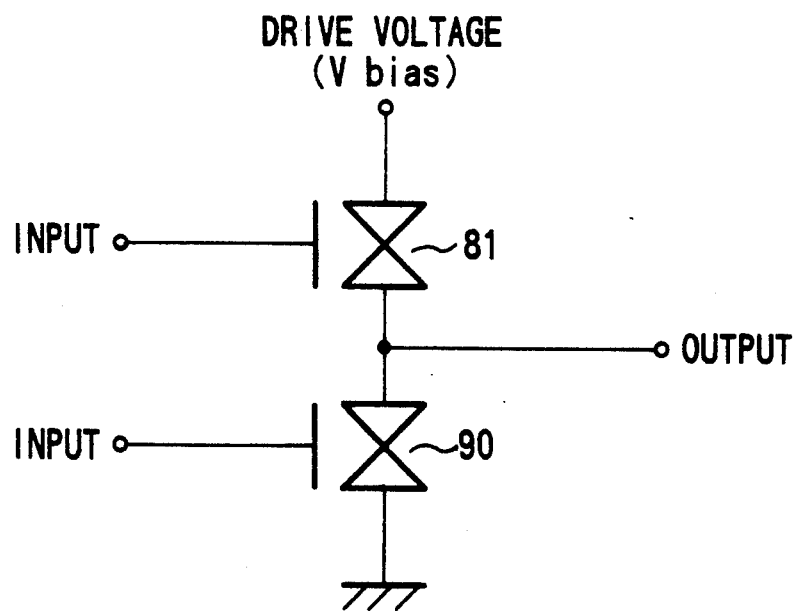

Although, in the present invention, the element on the ground side is used as a driver element, a driver element 90 and a load element 80 may exchange their roles, as shown in FIG. 6. Alternatively, as shown in FIG. 7, inputs may be applied to both the elements 80 and 90.

Assume that the two elements have different peak voltages (e.g., $V_{p1}$ and $V_{p2}$). The present invention can be applied to such a case if $2V_p$ in the above description is substituted by the sum of these peak voltages, i.e., $V_{p1} + V_{p2}$.

Embodiments based on the basic arrangement as the characteristic feature of the present invention will be described below.

Figure 8:
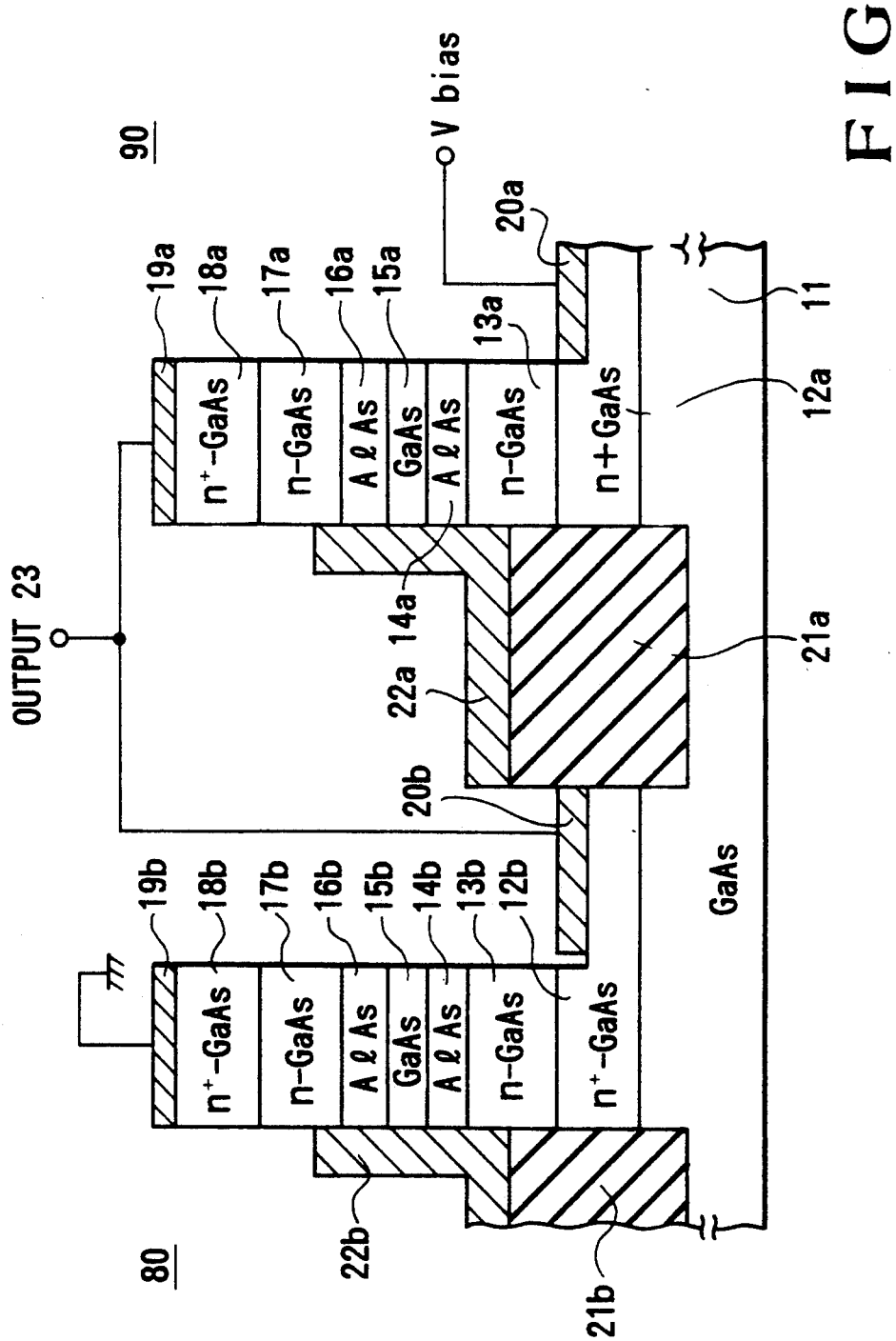
FIG. 8 is a sectional view showing the first embodiment of the present invention.

FIG. 8 shows the arrangement of a semiconductor logic circuit device according to the first embodiment of the present invention. In this embodiment, each of the series-connected elements 80 and 90 has one control electrode. It is, however, clear that various arrangements can be employed on the basis of the concepts of the above-described modifications of the present invention. Referring to FIG. 8, reference numeral 11 denote a semi-insulating GaAs substrate; 12a and 12b, 6,000-Å thick n+-GaAs buffer layers doped with Si at $2 \times 10^{18}$ cm$^{-3}$; 13a and 13b, collector layers consisting of 3,000-Å thick n-GaAs layers doped with, e.g., Si at $5 \times 10^{17}$ cm$^{-3}$; 14a and 14b, first barrier layers consisting of, e.g., 50-Å thick undoped AlAs layers, which are semiconductor layers whose band ends have high energy relative to the carriers in the collector layers 13a and 13b; 15a and 15b, well layers consisting of, e.g., 50-Å thick undoped GaAs layers, which are semiconductor layers whose band ends have low energy relative to the first barrier layers 14a and 14b; 16a and 16b, second barrier layers consisting of, e.g., 50-Å thick undoped AlAs, which are semiconductor layers whose band ends have high energy relative to the carriers in the collector layers 13a and 13b; 17a and 17b, emitter layers consisting of, e.g., 500-Å thick n-GaAs layers doped with Si at $5 \times 10^{17}$ cm$^{-3}$, which are semiconductor layers whose band ends have low energy relative to the carriers in the first barrier layers 14a and 14b and the second barrier layers 16a and 16b; and 18a and 18b, emitter contact layers consisting of 3,000-Å thick n+-GaAs layers doped with Si at $2 \times 10^{18}$ cm$^{-3}$. Crystal growth is performed by, e.g., molecular beam epitaxy. Upon completion of growth, mesa etching is performed to form a resonant tunneling diode, as shown in FIG. 8. Reference numerals 19a and 19b denote emitter electrodes; 20a and 20b, collector electrodes formed by depositing and alloying, e.g., AuGe/Ni; 21a and 21b, insulating layers consisting of, e.g., SiO$_2$; and 22a and 22b, control electrodes consisting of, e.g., Ti/Au, which are in contact with side surfaces of the respective collector and emitter layers to form a Schottky junction. Note that each element may include a plurality of control electrodes instead of one electrode. In addition, the respective electrodes may have different contact areas with each diode. Such two negative resistive elements are connected in series, as shown in FIG. 8, and an output terminal 23 is formed. Note that each component denoted by a reference numeral with an affix "a" corresponds to the driver element 90, whereas each component denoted by a reference numeral with an affix "b" corresponds to the load element 80.

An operation of the semiconductor logic circuit device thus fabricated will be described in more detail below with reference to FIGS. 9A and 9B corresponding to FIGS. 2A and 2C respectively showing monostable and bistable load characteristics.

Figures 9A, 9B:
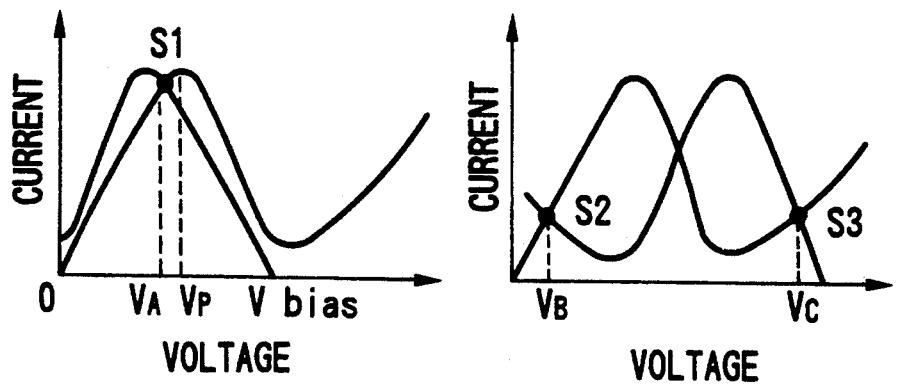
FIGS. 9A and 9B are graphs showing the switching characteristics of a semiconductor element used in the present invention.
Figure 10A:
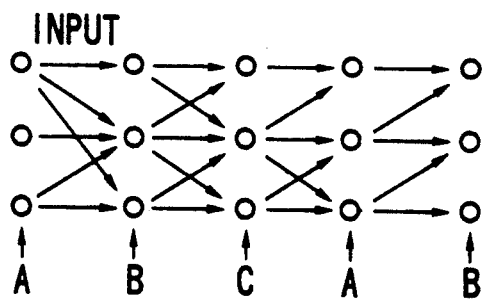
FIGS. 10A and 10B are views respectively showing the input/output relationship of the respective stages of a logic circuit constituted by the semiconductor device of the present invention, and clock signal waveforms for driving the respective stages.
Figure 10B:
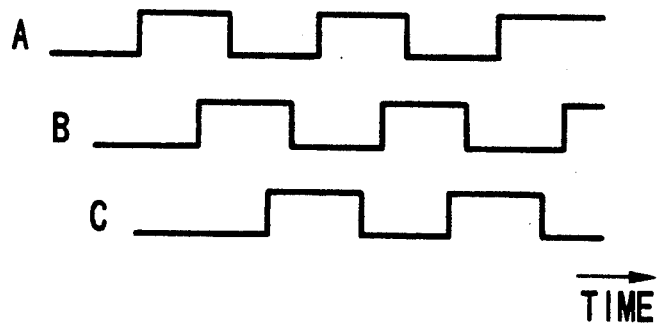

When the two negative resistive elements are connected in series, the stable point of the system changes from the state shown in FIG. 9A to the state shown in FIG. 9B in accordance with a power supply voltage $V_{bias}$. FIGS. 10A and 10B show this change in more detail. When the power supply voltage $V_{bias}$ is lower than twice the peak voltage $V_p$, a point S1 shown in FIG. 9A is a stable point, and an output voltage $V_A$ is $V_{bias}/2$. When the power supply voltage $V_{bias}$ exceeds $2V_p$, the system has two stable points S2 and S3, and an output voltage $V_B$ or $V_C$ is obtained in accordance with a stable point, as shown in FIG. 9B. In this case, a slight difference between the characteristics of the two negative resistive elements determines whether the system is stabilized at the point S2 or S3 in FIG. 9B.

Such a slight characteristic change can be produced by a voltage applied to the input terminals. More specifically, if positive voltages are applied to the control electrodes 22a and 22b, the depletion layers contract, similar to MESFETs, to increase the element areas in effect, resulting in an increase in current. As a result, the state with a higher voltage applied to an element having a smaller current amount is stabilized in terms of energy. Therefore, an output voltage can be determined. If negative voltages are applied, the reverse happens. It should be noted that only a small current change is required. If the two negative resistive elements are completely equivalent to each other, even a small current change of about 0.001% can achieve stable switching against thermal energy at room temperature. In practice, therefore, variations of negative resistive elements determine the minimum current required for switching. In any case, since only a small current change is required, the transconductance of the control electrodes 22a and 22b can be set to be small, and the input capacitance can also be greatly reduced. Therefore, the capacitance on the output side is scarcely increased with an increase in fan-out, preventing a decrease in operating speed.

A large number of input control electrodes 22a and 22b can be formed. In this case, a result is determined by a total change in currents of all the input terminals, and a kind of a majority logic circuit having positive and negative values. If the input electrodes are formed to have different sizes, weighting can be performed.

In order to realize a logic circuit using such negative resistive elements, a drive voltage periodically changing between 0V and a voltage higher than $2V_P$ is used as the power supply voltage $V_{bias}$. In this case, in order to use an output from a given negative resistive element as an input to the next negative resistive element, the output from the preceding negative resistive element must be determined in advance. For this reason, the phase of the drive voltage must be delayed. For example, in a multistage circuit having stages A, B, and C shown in FIG. 10A as a set, three-phase drive voltages may be applied to negative resistive elements A, B, and C belonging to the respective stages.

Figure 11:
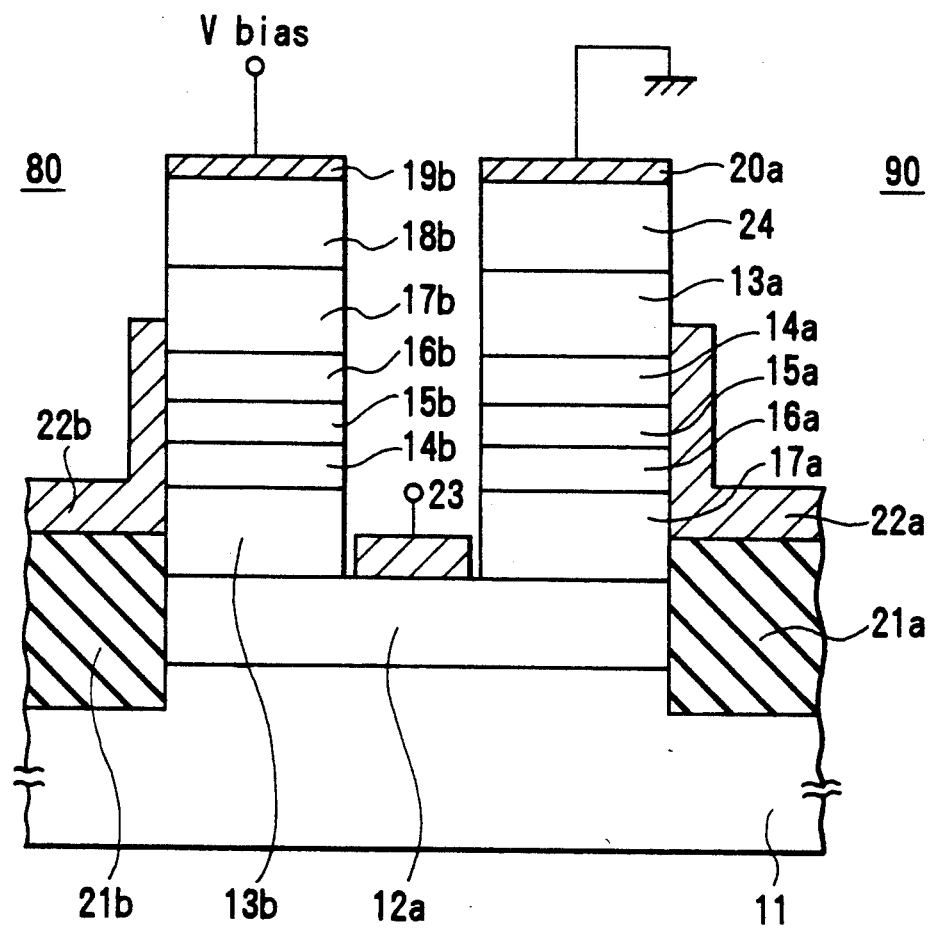
FIG. 11 is a sectional view showing the second embodiment of the present invention.

FIG. 11 shows the second embodiment of the present invention. This embodiment is different from the first embodiment in the connection structure of two negative resistive elements. More specifically, in the structure shown in FIG. 11, a collector layer 13b and an emitter layer 17a are connected to each other through a buffer layer 12a, and an output terminal 23 is formed on the buffer layer 12a. A collector electrode 20a is formed on the collector layer 13a through a collector contact layer 24 consisting of, e.g., n+-GaAs. The operation of the circuit device having this arrangement is the same as that of the embodiment shown in FIG. 8, and a detailed description thereof will be omitted.

Figure 12:
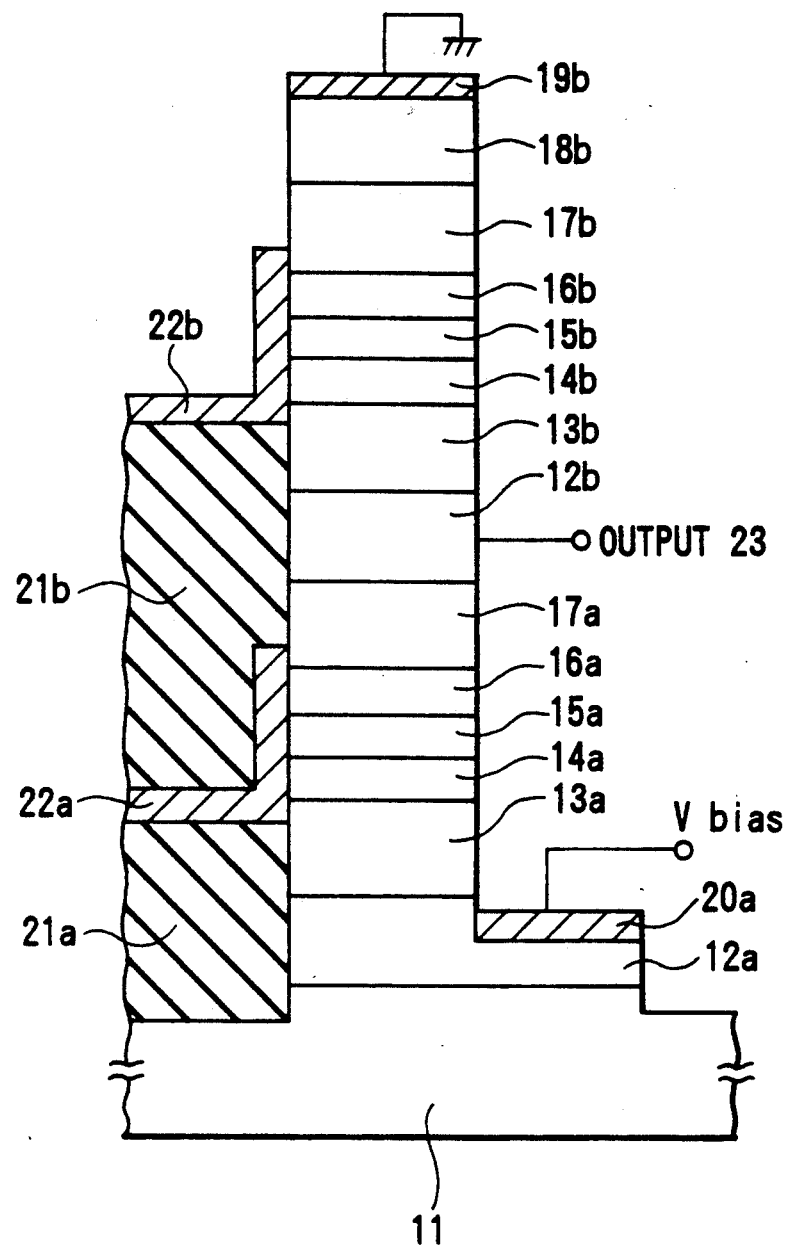
FIG. 12 is a sectional view showing the third embodiment of the present invention.

FIG. 12 shows the third embodiment of the present invention. The negative resistive element in FIG. 12 is obtained by vertically stacking the two negative resistive elements of the first embodiment in FIG. 1. The reference numerals in FIG. 12 correspond to those in FIG. 8. Such a structure can be easily formed by modifying the crystal growth process. Note that portions from which an output terminal 23 is extracted, which correspond to the emitter contact region 17a and the electrodes 19a and 20b in FIG. 8, are omitted, and that the structure of these portions is not shown in detail because it is a known structure.

Figure 13:
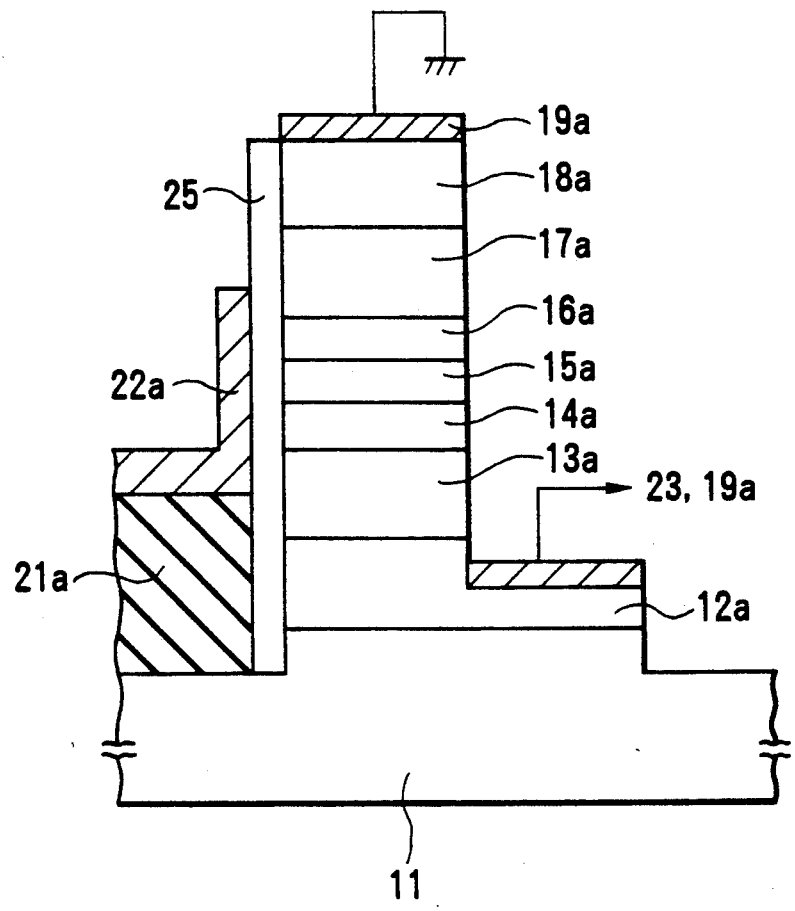
FIG. 13 is a sectional view showing the fourth embodiment of the present invention.

FIG. 13 shows the fourth embodiment of the present invention. FIG. 13 shows only an element corresponding to the three-terminal element 90 on the right side in FIG. 8. This element is obtained by connecting the control electrode 22a to the negative resistive element of the first embodiment through an insulating film or a gate barrier layer 25 consisting of, e.g., AlGaAs. This structure prevents the gate leakage current. It is clear that the structure can also be applied to the element 80 on the left side in FIG. 8.

In the above-described embodiments, AlGaAs/GaAs-based materials are used. However, the present invention is not limited to these. For example, InGaAs- and InP-based materials may be used instead. If the peak voltage is decreased by changing the material for a well layer, a reduction in power consumption can be effectively achieved.

In addition, in the above embodiments, if p-type doping is performed, holes can be used as carriers as well as electrons.

The present invention has been described with respect to a double barrier type resonant tunneling diode. However, the present invention can be applied to a structure in which gate electrodes are formed through Schottky gates or barrier layers by utilizing a resonance interband tunnel phenomenon using InAs/AlGaSb structures.

As described above, according to the first embodiment of the present invention, switching can be performed even with very small input signals without changing the output amplitude. According to the second embodiment, an operation can be performed at a very high speed. According to the third embodiment, since even a very small signal can drive a succeeding stage, a large number of elements can be connected to the succeeding stage with almost no reduction in operating speed. In addition, according to the fourth and fifth embodiments, a large number of input terminals can be connected to each element to realize various functions.

Furthermore, with the arrangement of each embodiment described above, a semiconductor logic circuit device having an operating speed higher than that of the conventional device can be provided regardless of fanout.

Moreover, in the above-described embodiments, resonant tunneling diodes are used. However, the present invention is not limited to this. For example, the present invention can be realized by p-n junction tunneling diodes or single barrier type negative resistive elements using InAs/AlGaSb/InAs structures.

In the above embodiments, a resonant tunneling FET using a Schottky junction is used. In such an arrangement, when a voltage is applied to a control electrode, the size of a depletion layer of the Schottky junction changes in accordance with the polarity of the voltage, thus causing a change in current flowing in the diode. However, since the Schottky barrier height is limited to about 0.8V, a leakage current is produced, and the allowable applied voltage is limited. This phenomenon is especially conspicuous when a positive voltage is applied. In addition, it is not easy to form a Schottky type control electrode on a side surface of a diode structure with high precision, posing a problem in terms of manufacturing techniques.

Other embodiments of the present invention, which are made in consideration of these problems, will be described below.

Figure 14:
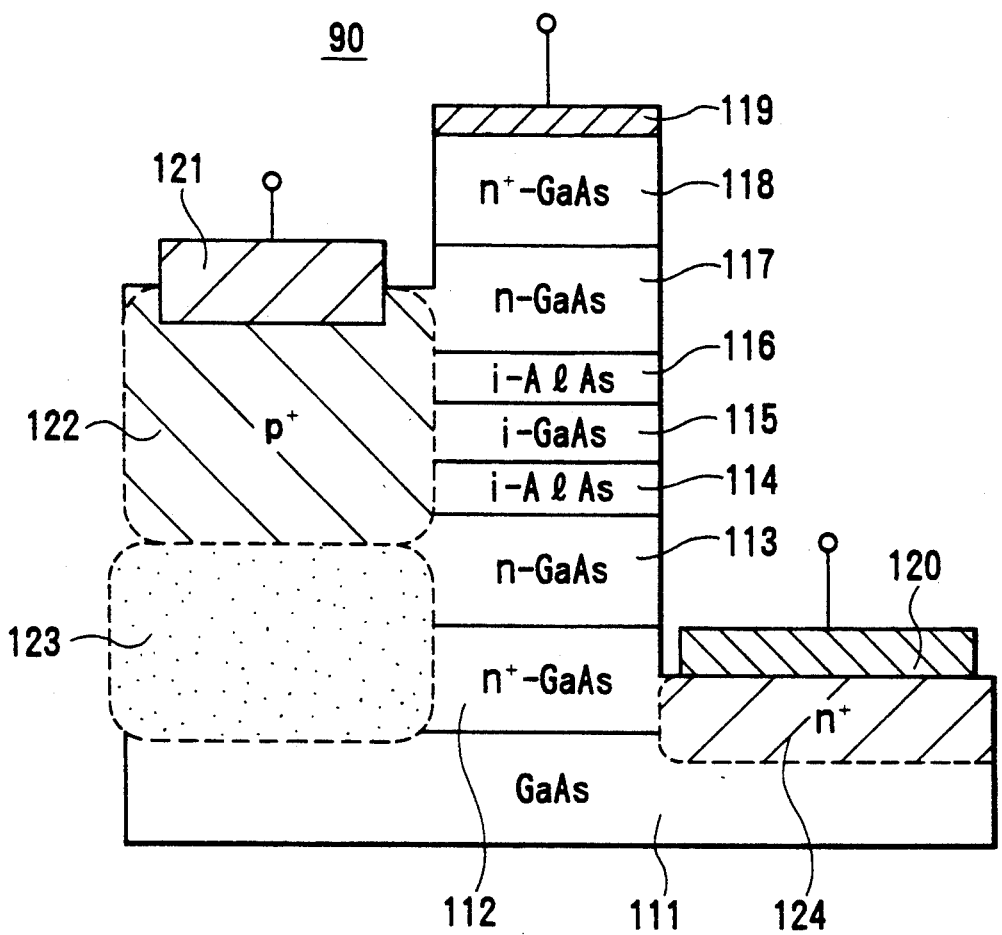
FIG. 14 is a sectional view showing one of negative resistive elements according to the fifth embodiment of the present invention.

FIG. 14 shows the fifth embodiment of the present invention. FIG. 14 shows an element 90, one of two elements each having a negative resistance characterized by the present invention. It is apparent that the other element can also have the same arrangement. Referring to FIG. 14, reference numeral 111 denotes a semi-insulating GaAs substrate; 112, a 6,000-Å thick n+-GaAs buffer layer doped with Si at $2 \times 10^{18}$ cm$^{-3}$; 113, a collector layer consisting of, e.g., a 3000-Å thick n-GaAs layer doped with Si at $5 \times 10^{17}$ cm$^{-3}$; 114, a first barrier layer consisting of, e.g., a 50-Å thick undoped AlAs layer; 115, a well layer consisting of, e.g., a 50-Å thick undoped GaAs layer; 116, a second barrier layer consisting of a 50-Å thick undoped AlAs layer; 117, an emitter layer consisting of, e.g., a 500-Å thick n-GaAs layer doped with Si at $5 \times 10^{17}$ cm$^{-3}$; and 118, an emitter contact layer consisting of 3,000-Å thick n+-GaAs layer doped with Si at $2 \times 10^{18}$ cm$^{-3}$.

Reference numeral 119 denotes an emitter electrode; 120, a collector electrode formed by depositing and alloying, e.g., AuGe/Ni; 121, a control electrode formed by depositing, e.g., AuZn/Ni and alloying it at 400° C.; 122, a p+-type region formed by Zn diffused from the control electrode 121; and 123, a high-resistance layer formed by ion implantation of H+ or O+. The steps in manufacturing this element will be described below with reference to FIGS. 15A to 15F.

Figure 15A:
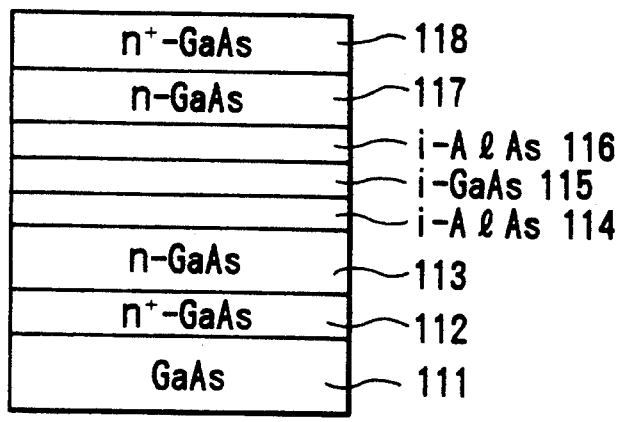
FIGS. 15A to 15F are sectional views showing steps in a method of manufacturing the element shown in FIG. 14.
Figure 15B:
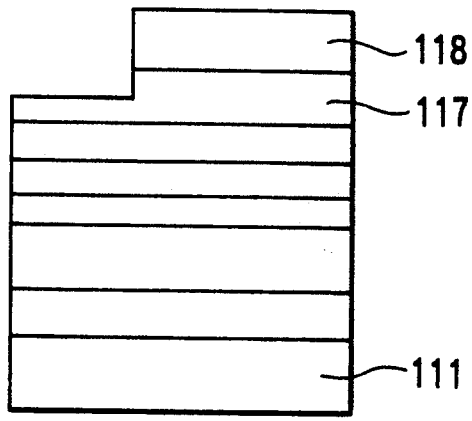
Figure 15C:
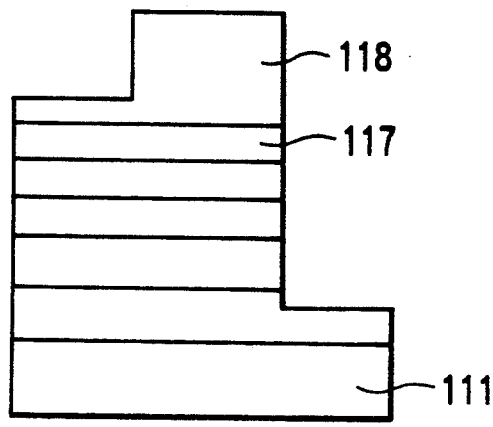

According to the element of this embodiment, as shown in FIG. 15A, the following layers are sequentially stacked on the semi-insulating GaAs substrate 111 by, e.g., molecular beam epitaxy: the n+-GaAs buffer layer 112, the n−-GaAs collector layer 113, the first i-AlAs barrier layer 114, the i-GaAs layer 115, the second i-AlAs barrier layer 116, the n-GaAs emitter layer 117, and the n+-GaAs emitter contact layer 118. After this crystal growth process, as shown in FIG. 15B, a region for the control electrode 121 is mesa-etched by using, e.g., a solution of $H_2SO_4:H_2O_2:H_2O$ (10:1:1×1/100). Similarly, as shown in FIG. 15C, a region for the collector electrode 120 is etched by using the same solution.

Figure 15D:
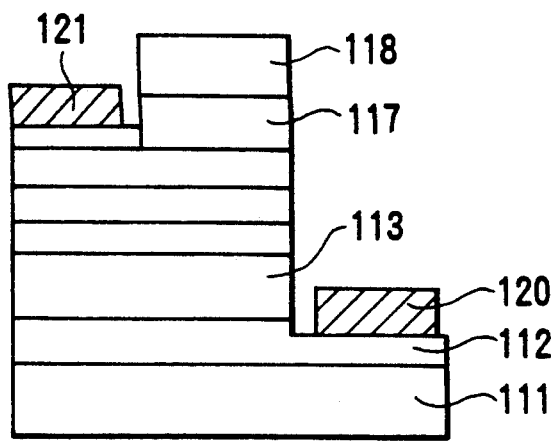
Figure 15E:
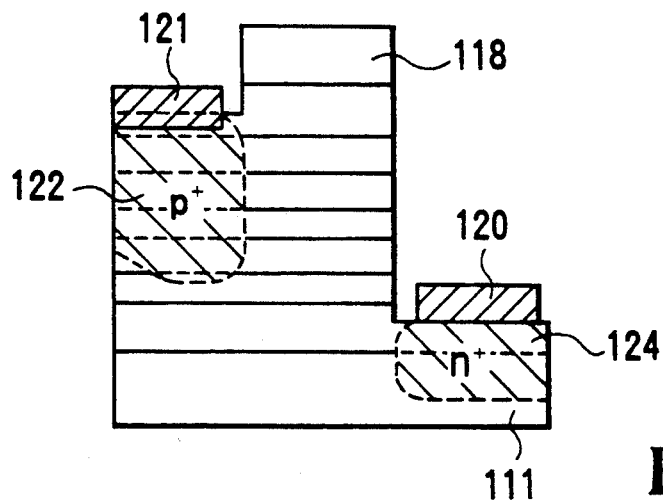

As shown in FIG. 15D, AuGe/Ni containing Ge as an N-type impurity is deposited and is patterned by a liftoff method. At the same time, AuZn/Ni containing Zn as a p-type impurity is deposited and is patterned by the liftoff method. Thereafter, as shown in FIG. 15E, these metals are simultaneously annealed at 400° C. for 60 seconds to be alloyed, thus forming the p+- and n+-type regions 122 and 124 as well as the collector electrode 120 and the control electrode 121. Alloying is performed only once because two alloying processes will excessively broaden the n+- or p+-type region 122 or 124 due to diffusion and the like.

Figure 15F:
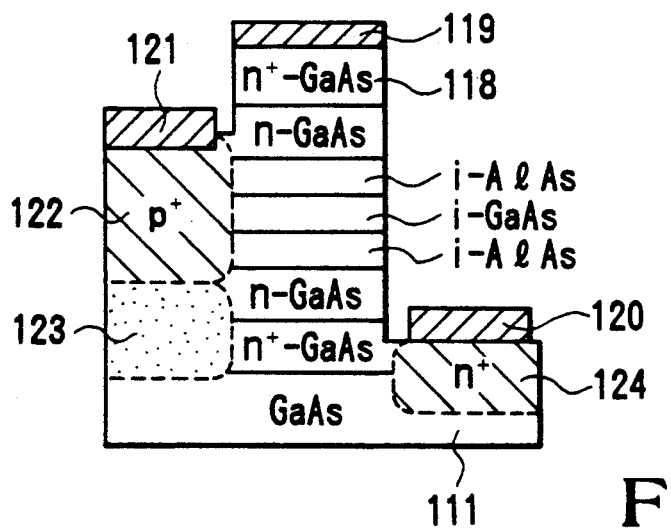

In addition, Ti/Au is deposited and is patterned by the liftoff method to form the emitter electrode 119. As shown in FIG. 15F, H+ ions are implanted into a predetermined region to form the high-resistance layer 123. With this process, the resonant tunneling FET 90 having the structure shown in FIG. 14 is completed. Although the high-resistance layer 123 is preferably formed after annealing (alloying), it may be formed after the step in FIG. 15C (i.e., before annealing). Note that if O+ ions are to be implanted, the layer 123 is preferably formed before annealing.

According to the structure of this embodiment, since the area of a resonant tunneling diode is determined by the degree of extension of a depletion layer of a p-n junction, the leakage current is reduced, and a higher voltage can be applied as compared with the case of the Schottky junction. In addition, since the p-type region 122 is formed by diffusion of Zn, diffusion is also caused in a lateral direction. For this reason, even if the control electrode 121 is separated from the diode portion (by, e.g., 0.3 μm), a high transconductance can be expected. Therefore, the manufacture is facilitated as compared with the structure using Schottky electrodes. Furthermore, since the size of the p+-type region 122 is determined by the thickness of a metal to be deposited and an alloying temperature, the region 122 can be formed with high uniformity and reproducibility.

Note that in the embodiment shown in FIG. 14, although the high-resistance layer 123 is formed to eliminate an unnecessary capacitance so as to increase the operating speed, it can be omitted.

If a resonant tunneling barrier as a spacer layer is sandwiched between undoped layers or N-type layers each having a low concentration (e.g., $10^{16}$ cm$^{-3}$), a depletion layer can effectively extend into the resonant tunneling portion, thus improving the current modulation efficiency without causing an increase in collector resistance or emitter resistance. In addition, a plurality of control electrodes, each identical to the control electrode 121, can be formed instead of one electrode.

Although the embodiment in FIG. 14 has been described with respect to an N-type element, a p-type element can also be formed by exchanging n- and p-type layers and replacing the AuZn/Ni contacts with ohmic contacts consisting of N-type materials such as AuGe/Ni/Ti/Au. In addition, the present invention is not limited to the structure shown in FIG. 14. For example, the vertical positions of the collector layer 113 and the emitter layer 117 with reference to the well layer 115 may be reversed.

As has been described above, according to the device of the embodiment shown in FIG. 14, since a p-n junction is used as a barrier for a control electrode in a negative resistive element having a resonant tunneling structure, the area of a diode structure is determined by the degree of extension of a depletion layer. Therefore, the leakage current is small, and a high input voltage can be applied. In addition, a very fast operation can be performed, and the device can be easily manufactured. Similar to the above-described embodiments, according to the arrangement of this embodiment, if these two elements having negative resistive elements are connected in series, a switching operation can be performed with very small input signals without changing the output amplitude. Furthermore, since only a very small signal is required to drive a succeeding stage, a large number of elements can be connected to the succeeding stages. Moreover, since a large number of input terminals can be connected, various functions can be realized.

FIG. 16 shows the sixth embodiment of the present invention, in which each element has a plurality of control electrodes. This embodiment is shown in FIG. 16 in correspondence with the one shown in FIG. 14. However, the concept of this embodiment can be easily developed and applied to other embodiments. Note that the control electrodes and the associated regions are denoted by reference numerals with affixes "A" and "B".

Figure 17:
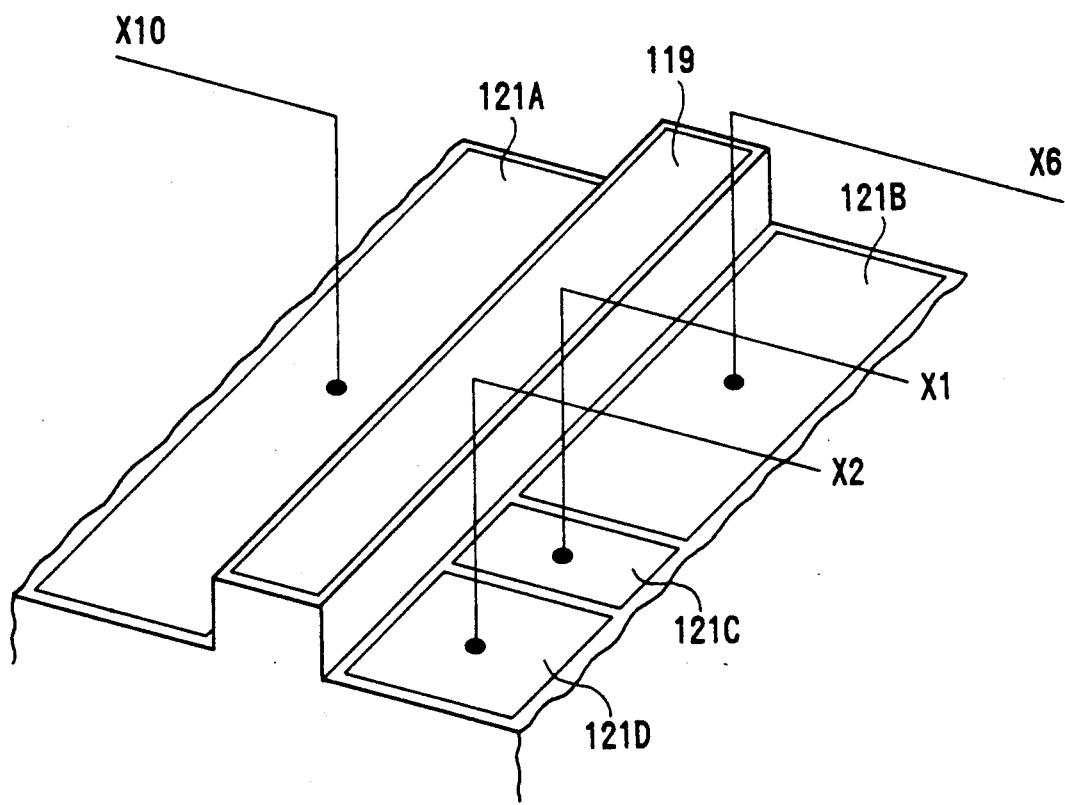
Figure 18:
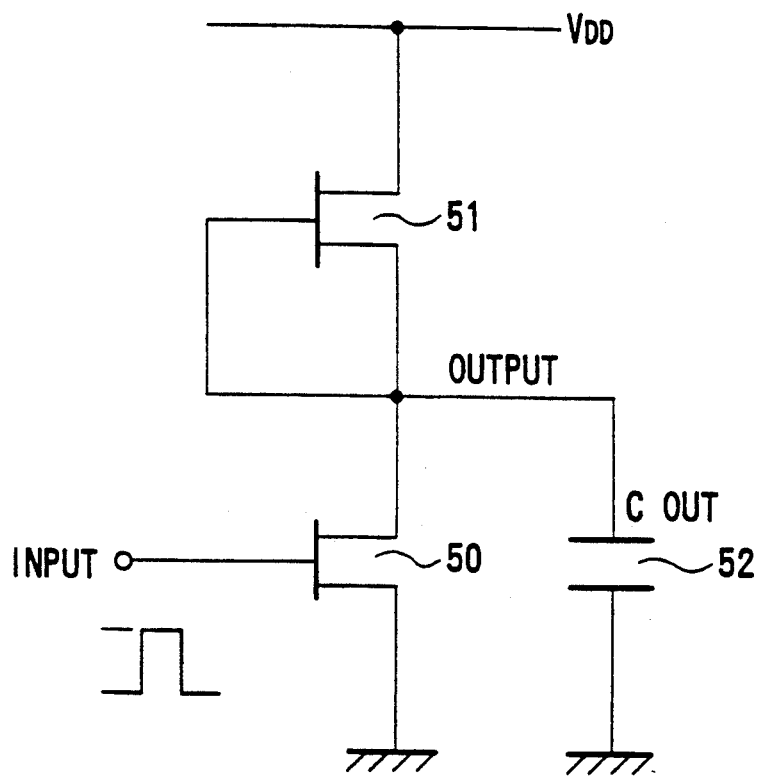
FIG. 18 is a circuit diagram showing a conventional semiconductor logic circuit device using a negative resistive element.

FIG. 17 shows the seventh embodiment of the present invention and, more particularly, a structure of four weighted control electrodes 121A, 121B, 121C, and 121D. FIG. 17 shows leads extracted from the control electrodes together with weighting ratios. These ratios are determined in correspondence with the areas of the respective electrodes. This structure is developed from the one shown in FIG. 16. In the structure, the respective electrodes are formed on the opposite sides of an element.

In the above-described embodiments, drive voltages for driving the series circuit of the two negative resistive elements are not limited to the rectangular pulses shown in FIG. 10B, but sine waves or triangular waves may be used as long as they have oscillating or periodic waveforms.

What is claimed is:

1. A semiconductor logic circuit device, wherein two semiconductor elements having N-type negative resistance characteristics are connected in series to obtain a series circuit, two ends of said series circuit serve as drive voltage terminals across which a periodic drive voltage is applied, at least one of said semiconductor elements has a control electrode to which a voltage is applied to change the peak current, and a connection point between said two semiconductor elements serves as an output terminal.

2. A device according to claim 1, wherein said control electrode of said semiconductor element is formed by a Schottky junction.

3. A device according to claim 1, wherein each of said semiconductor elements is a resonant tunneling element comprising an emitter semiconductor layer, a first barrier semiconductor layer serving as a barrier against carriers in said emitter semiconductor layer, a well semiconductor layer whose band end has low energy relative to carriers in said first barrier semiconductor layer, a second barrier semiconductor layer serving as a barrier against carriers in said emitter semiconductor layers and said well semiconductor layer, and a collector semiconductor layer whose band end has low energy relative to carriers in said second barrier semiconductor layer.

4. A device according to claim 1, further comprising a plurality of series circuits, each identical to said series circuit, each of said series circuits having an output terminal connected to a control electrode of a succeeding series circuit.

5. A device according to claim 4, wherein each negative resistance element is characterized by a peak voltage at which a maximum current flows and above which current decreases and wherein a voltage periodically changing to a voltage higher than a sum of two peak voltages is applied to said driving terminal of said series circuit.

6. A device according to claim 5, wherein a periodic drive voltage having a phase different from that of a drive voltage applied to a given one of said series circuits is applied to a driving terminal of a series circuit next to said given series circuit.

7. A device according to claim 1, wherein said emitter semiconductor layer and said collector semiconductor layer have the same conductivity type.

8. A device according to claim 7, wherein said semiconductor element having said control electrode comprises a collector electrode connected to said collector semiconductor layer, an emitter electrode connected to said emitter semiconductor layer, and a conductive region having a conductivity type different from that of said emitter semiconductor layer and said collector semiconductor layer and formed adjacent to said collector semiconductor layer, said first barrier semiconductor layer, said second barrier semiconductor layer, said well semiconductor layer, and said emitter semiconductor layer, and said control electrode is arranged adjacent to said conductive region.

9. A device according to claim 1, wherein said semiconductor element comprises a plurality of control electrodes, each identical to said control electrode.

10. A device according to claim 9, wherein each of said control electrodes is characterized by a length and a width and wherein said control electrodes are weighted by changing the magnitude of said width.

* * * * *